(12) United States Patent
Kuraguchi

(10) Patent No.: US 8,841,681 B2
(45) Date of Patent: Sep. 23, 2014

(54) WIDE-GAP SEMICONDUCTOR SUBSTRATE AND METHOD TO FABRICATE WIDE-GAP SEMICONDUCTOR DEVICE USING THE SAME

(75) Inventor: Masahiko Kuraguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/984,106

(22) Filed: Jan. 4, 2011

(65) Prior Publication Data

US 2012/0012857 A1 Jan. 19, 2012

(30) Foreign Application Priority Data

Jul. 13, 2010 (JP) ................................ 2010-158907

(51) Int. Cl.
- H01L 23/544 (2006.01)
- H01L 21/66 (2006.01)
- G03F 9/00 (2006.01)

(52) U.S. Cl.
CPC ..... *H01L 23/544* (2013.01); *H01L 2223/54426* (2013.01); *G03F 9/708* (2013.01); *G03F 9/7076* (2013.01)
USPC .............. 257/76; 257/E21.522; 257/E23.179; 438/14

(58) Field of Classification Search
USPC ................ 257/76, E21.522, E23.179; 438/14
See application file for complete search history.

(56) References Cited

U.S. PATENT DOCUMENTS

| | | | | |
|---|---|---|---|---|
| 4,338,620 A | * | 7/1982 | Kawabe | 257/520 |
| 2005/0023656 A1 | * | 2/2005 | Leedy | 257/678 |
| 2011/0049681 A1 | * | 3/2011 | Vielemeyer | 257/627 |
| 2011/0129948 A1 | * | 6/2011 | Hsieh et al. | 438/16 |

FOREIGN PATENT DOCUMENTS

| | | |
|---|---|---|
| JP | 8-55770 | 2/1996 |
| JP | 2002-344028 | 11/2002 |
| JP | 2007-123781 | 5/2007 |
| JP | 02007123781 A * | 5/2007 |
| JP | 2007-273727 | 10/2007 |

OTHER PUBLICATIONS

Japanese Office Action issued Apr. 3, 2012, in Japan patent Application No. 2010-158907 (with English translation).

* cited by examiner

*Primary Examiner* — Matthew W Such
*Assistant Examiner* — David Spalla
(74) *Attorney, Agent, or Firm* — Oblon, Spivak, McClelland, Maier & Neustadt, L.L.P.

(57) ABSTRACT

A wide-gap semiconductor substrate includes a narrow-gap semiconductor layer, a wide-gap semiconductor layer and an alignment mark. The narrow-gap semiconductor layer has a main surface. The wide-gap semiconductor layer is epitaxially grown on the narrow-gap semiconductor layer. The alignment mark is preliminarily carved in a prescribed position on the main surface so that the alignment mark is preliminarily buried in the wide-gap semiconductor substrate.

4 Claims, 10 Drawing Sheets

WIDE-GAP SEMICONDUCTOR SUBSTRATE AND METHOD TO FABRICATE WIDE-GAP SEMICONDUCTOR DEVICE USING THE SAME

CROSS REFERENCE TO RELATED APPLICATION

This application is based upon and claims the benefit of priority from the prior Japanese Patent Application No. 2010-158907, filed on Jul. 13, 2010, the entire contents of which are incorporated herein by reference.

FIELD

Embodiments relate basically to a method to fabricate a semiconductor substrate provided with an alignment mark to be used for an alignment of a transparent substrate at the time of processing thereof, and a method to fabricate a semiconductor device.

BACKGROUND

A wide-gap semiconductor has a high breakdown voltage, and is, therefore, employed to enable a semiconductor device having a high output, a high breakdown voltage, and a low on-state resistance. It is known that the wide gap semiconductors include a nitride semiconductor, silicon carbide, diamond, etc. A high output, a high breakdown voltage, and a low on-state resistance of a semiconductor device are acquired using these semiconductors. A nitride semiconductor layer can be grown epitaxially on various kinds of substrates, thereby enabling it to epitaxially grow the nitride semiconductor layer on a Si layer and to provide a large-area and low-cost nitride semiconductor substrate.

A photolithography machine is needed to fabricate a semiconductor device, and a high-accuracy alignment is further required for recently advanced miniaturization of the device. Accordingly, it is important to employ short-wavelength light sources for lithographic exposure and substrate detection, i.e., for the miniaturization and the high-accuracy substrate alignment, respectively. Longer wavelength light has a tendency to more spatially spread, thereby making it difficult to perform the miniaturization and the high-accuracy substrate alignment. Therefore, visible light having a shorter wavelength than infrared light is preferably employed for, e.g., a pattern alignment in the lithographic exposure process of semiconductor manufacturing equipment. Detecting light is directed onto an alignment mark formed on a semiconductor substrate, and the detecting light reflected from the alignment mark is detected to perform the substrate alignment.

A substrate with a wide-gap semiconductor layer epitaxially grown thereon is employed to manufacture a power device or a radio-frequency device. The wide-gap semiconductor layer made of gallium nitride or aluminum nitride, which is transparent to not only infrared light but also visible light, was grown on a transparent sapphire or silicon carbide substrate. Furthermore, a GaN layer is grown epitaxially on a Si layer to provide a large-area and low-cost GaN substrate. In each case, carved concaves 62 are formed, e.g., on the surface of the GaN epitaxial layer to provide an alignment mark for the substrate alignment as shown in FIGS. 6A and 6B.

However, the carved concaves 62 are transparent to detecting light. Therefore, the detecting light reflected from edges of the carved concaves 62 is detected for the substrate alignment. However, the intensity of the detecting light reflected from the edges is so low that a proposal is made in which carved concaves are formed into two-step concave shapes in order to increase the intensity of detecting light reflected therefrom.

The substrate position and a prescribed point on the substrate cannot be accurately detected or pinpointed without detecting enough intensity of the reflected light from the alignment mark. Moreover, as shown in FIG. 6C, metal marks 63 made of a metal can be employed to reflect the detecting light, instead of the carved concaves 62 mentioned above. However, in case that the metal marks 63 are employed, extra steps for exclusive use are required so that a fabrication process of a device increases the number of steps included therein, thereby producing a risk that an insulating layer is contaminated by the metal employed for the metal marks 63. This has been a factor for complicating the fabrication process and reducing the reliability thereof, e.g., lowering a breakdown voltage of the device.

A wide-gap semiconductor is mostly transparent to visible light. Therefore, the intensity of the visible light reflected from an alignment mark to be formed by carving the wide-gap semiconductor substrate is too low to carry out a substrate alignment for the wide-gap semiconductor substrate using visible light of exposure equipment. When the alignment mark is prepared using, e.g., a metal on the wide-gap semiconductor substrate, the metal causes contamination in the subsequent steps of the device-manufacturing process. For example, the metal used for the alignment mark contaminates an apparatus for preparing an insulator film to be used subsequently to the preparation of the metal alignment mark, and reduces a break-down voltage of the semiconductor devices produced in the device-manufacturing process.

When Si is epitaxially grown on an alignment mark formed on a Si layer, the alignment mark thereon often deforms to reduce the accuracy of a substrate alignment. A method is disclosed as a means to prevent such a reduction in accuracy of the substrate alignment. The method employs detecting light with a wavelength of 1 μm or more, and provides a substrate alignment having a lower accuracy than a method employing visible light as detecting light.

There is a limit on reducing on-state resistances of the wide-gap semiconductor devices and controlling variations in the on-state resistances thereof, unless a more accurate substrate alignment can be carried out using detecting light, e.g., visible light.

BRIEF DESCRIPTION OF DRAWINGS

Aspects of this disclosure will become apparent upon reading the following detailed description and upon reference to accompanying drawings. The description and the associated drawings are provided to illustrate embodiments of the invention and not limited to the scope of the invention.

DESCRIPTION

Figure 1A:
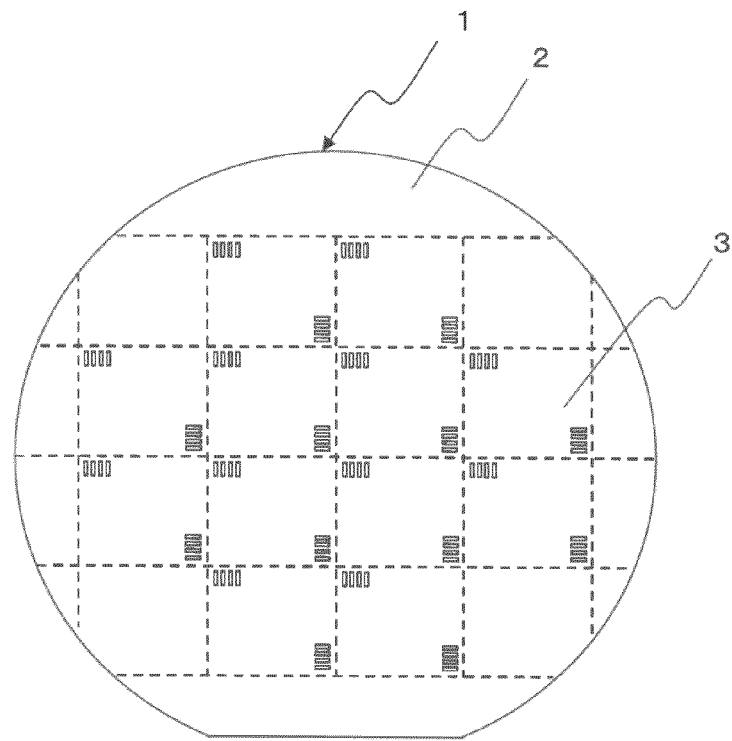
FIGS. 1A and 1B are plan views showing a wide-gap semiconductor substrate with an alignment mark according to a first embodiment.

Embodiments are explained below with reference to drawings. The drawings are conceptual. Therefore, a relationship between the thickness and width of each portion and a proportionality factor among the respective portions are not necessarily the same as an actual one therebetween. Even when the same portions are drawn, their sizes or proportionality factors are represented differently from each other with respect to the drawings. Wherever possible, the same reference numerals or marks will be used to denote the same or like portions throughout figures, and overlapped explanations are omitted in embodiments following a first embodiment.

First Embodiment

Figure 1B:
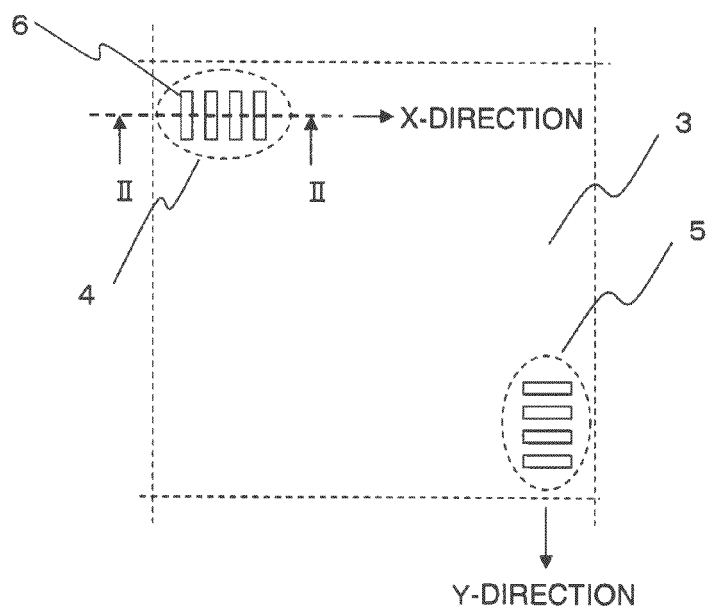

FIG. 1A is a view showing a whole wide-gap semiconductor wafer. FIG. 1B are plan views showing a wide-gap semiconductor substrate 1 with an alignment mark according to a first embodiment. The embodiment shown in FIGS. 1A and 1B models a case where two or more semiconductor devices are formed on the wide-gap semiconductor substrate 1 with the alignment marks. In the first embodiment, the semiconductor substrate 1 includes a wide gap semiconductor which is a nitride semiconductor, and will be explained on the basis of the "wide gap semiconductor substrate" which specifically has a GaN (gallium nitride) layer as a main semiconductor layer.

That is, as shown in FIG. 1A, a device-forming area 3, i.e., the substrate 1 to fabricate a GaN device are provided to a Si layer 2 which is a "base" for the wide gap semiconductor substrate 1 with the alignment mark. As shown in FIG. 1B, the alignment marks (carved concaves) 4 and 5 are formed at a prescribed position of each device-forming area on the Si layer 2 to detect the X-direction position and the Y-direction position, respectively. And, the GaN layer is epitaxially grown on the Si layer 2 as a main semiconductor layer, i.e., a layer to form a wide-gap semiconductor device. The alignment marks 4 and 5 include two or more carved concaves 6 aligned in the X- and Y-directions, respectively, at certain intervals.

Figure 2:
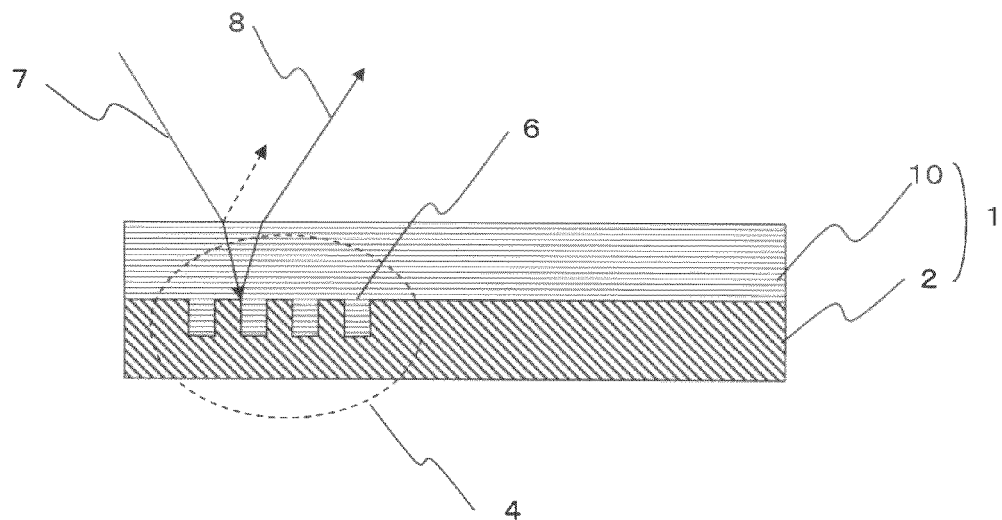
FIG. 2 is a sectional view schematically showing a section of the wide gap semiconductor substrate with the alignment mark.

FIG. 2 is a sectional view schematically showing a section of the wide gap semiconductor substrate 1 with an alignment mark. FIG. 2 shows the section of the alignment mark 4 to be cut along the II-II line and perpendicularly to the plane of paper of FIG. 1B. In addition, the alignment mark 5 in the Y-direction has the same sort of section. As shown by the dashed line in FIG. 2, the alignment mark 4 includes four concaves 6 to be formed by carving the Si layer 2 and to be aligned at certain intervals. Each of these concaves 6 is carved to be rectangular in cross-sectional shape. A depth of the concaves 6 is 0.2 µm to 0.5 µm, and the width thereof is 5 µm, for example. The distance between the adjacent concaves 6 is several tens of micrometers, for example. Furthermore, a GaN layer having a thickness of 1 µm to 2 µm is epitaxially grown on a buffer layer provided to the surface of the Si layer 2 with the alignment mark. The depth of the concaves 6 is defined as a distance between the bottom of the carved concaves on the Si layer 2 and a main surface of the Si layer 2. The main surface of the Si layer 2 means a polished flat surface without carved concaves thereon or therein.

That is, a wide-gap semiconductor layer (e.g., a GaN layer) is epitaxially grown on a surface of a narrow-gap semiconductor substrate layer (e.g., the Si layer 2) having the alignment mark preliminarily formed, thereby providing a wide-gap semiconductor substrate with the alignment mark buried therein for a substrate alignment. In this embodiment, only the GaN layer 10 is shown in FIG. 2. Alternatively, an AlGaN layer, an InAlN layer, or a laminated structure of these can be employed to fabricate semiconductor devices including a radio-frequency device, a power device, etc. In FIG. 2, the buffer layer is omitted and is not shown.

Just before fabricating a semiconductor device based on the GaN layer as a main semiconductor, the alignment mark 4 is irradiated with detecting light from an alignment light source to determine the position thereof by detecting the reflected light 8 of the detecting light. A laser beam having a wavelength of 633 nm is employed for the detecting light 8, i.e., irradiation light from the alignment light source. Therefore, the accuracy of the substrate alignment using the 633 nm laser beam is basically higher than accuracy using infrared light with a wavelength of 1 µm or more.

In the embodiment, the GaN layer 10 is employed for the wide-gap semiconductor layer, and is, therefore, transparent to visible light whose wavelength is 633 nm or so. As shown in FIG. 2, the detecting light 7 passes through the GaN layer 10 to be reflected by the Si layer 2. Forming the alignment mark 4 of carved type preliminarily on the Si layer 2 is followed by epitaxially growing the GaN layer thereon. When 633 nm visible light is employed for the detecting light, the alignment mark 4 of carved type is not required to be formed on the GaN layer 10. Furthermore, a GaN layer as thick as the depth of the carved concaves of the alignment mark 4 is formed on the Si layer 2 having the alignment mark 4, thereby allowing it to provide the GaN layer having a flat surface even on the concavoconvex alignment mark 4 of the Si layer 2. For this reason, both the detecting light 7 reflected on the flat surface of the GaN layer 7 and the reflected light 8 coming out of the GaN layer 10 contribute to position detection of edges of the concavoconvex alignment mark 4, thereby allowing it to maintain the accuracy of the position detection of the edges. Here, the detecting light 7 is incident on the flat GaN layer 10, and undergoes a specular reflection thereon. The reflected light 8 comes out of the GaN layer 10 as a result of the specular reflection of the detecting light 7 on a flat surface of the Si layer 2.

A method to fabricate the alignment mark of the wide-gap semiconductor substrate 1 will be explained with reference to FIGS. 3A to 3E. FIGS. 3A to 3E are sectional views showing a process sequence of a carved alignment mark as an example.

Figure 3A:
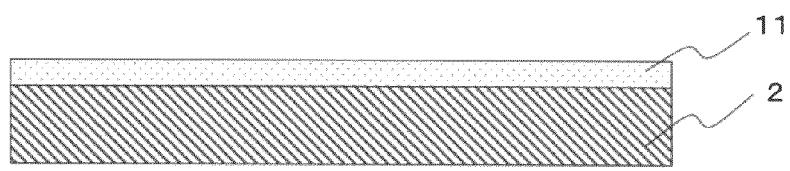
FIGS. 3A to 3E are views showing an example of a method to fabricate a alignment mark of carved type in process sequence.
Figure 3B:
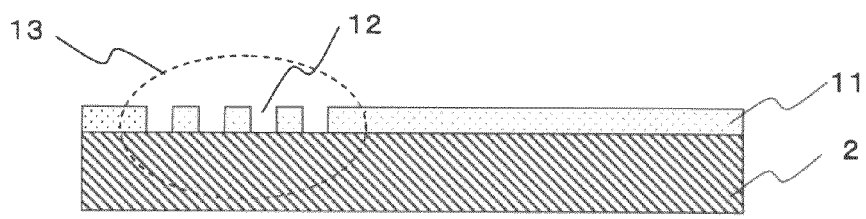
Figure 3C:
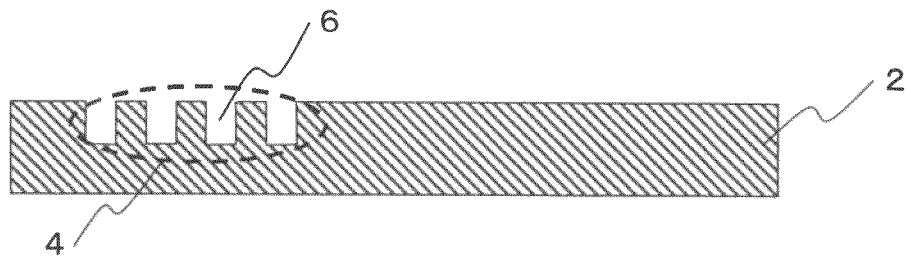

As shown in FIGS. 3A to 3E, the alignment mark 4 including the concaves 6 is formed on the Si layer 2 before an epitaxial growth of the GaN layer 10. First, as shown in FIG. 3A, resist (photoresist) is applied on the Si layer 2 with a spin coater, etc. to form a resist layer 11. Next, the resist layer 11 on the Si layer 2 is exposed to a mask pattern of light, and is followed by developing the resist layer 11 with a developer. After developing, as shown in FIG. 3B, the resist layer 11 is partially removed from an area 13 to form the alignment mark, while the resist layer 11 is left on the rest other than the area 13. These steps are further followed by dry etching to remove a portion of the Si layer 2 in openings 12 as shown in FIGS. 3B to 3C. After the dry etching, the resist layer 11 left on the Si layer 2 is entirely removed with an organic solvent, thereby providing the Si layer with the alignment mark 4 of carved type whose concaves have a depth of 1 μm, for example, as shown FIG. 3C.

Furthermore, after the whole Si layer 2 is washed to be cleaned, the GaN layer 10 is grown on the cleaned Si layer 2 by means of a widely known vapor-phase epitaxial method. However, just before the growth of the GaN layer 10, a buffer layer is epitaxially grown on the Si layer 2 in order to relax a lattice mismatch between Si and GaN. Subsequently, the GaN layer 10 is epitaxially grown without a vacuum break using the vapor-phase method. In addition, a (111) Si wafer is employed for the Si layer 2. That is, it is preferable to use a single crystal (111) Si substrate.

The GaN layer is epitaxially grown on the buffer layer having been formed on the Si layer 2 by means of a widely known MOCVD (Metal Organic Chemical Vapor Deposition) method. Alternatively, a multilayer including a laminated layer of AlN-sublayer/GaN-sublayer can be employed for the buffer layer. The AlN layer, i.e., a first sublayer, is epitaxially grown on the surface of the alignment mark 4 of the Si layer 2 by means of the MOCVD method, and is followed by growing the GaN layer as a second sublayer thereon. These two sublayers are alternately laminated, thereby forming the laminated layer, i.e., a multilayer between the Si layer 2 and the GaN layer 10 as a main semiconductor layer. However, the buffer layer is not shown in FIGS. 3A to 3E. Moreover, the buffer layer is not shown below also in FIGS. 4A to 5O.

Figure 3D:
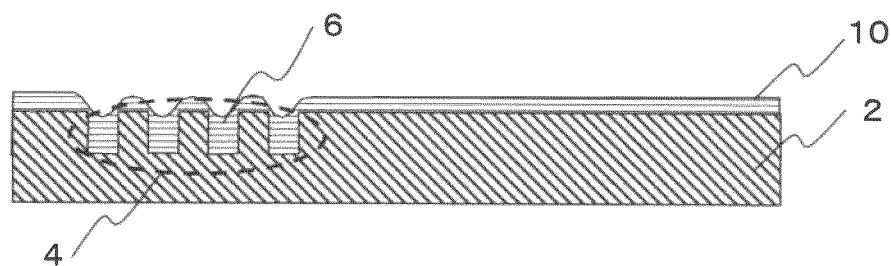
Figure 3E:
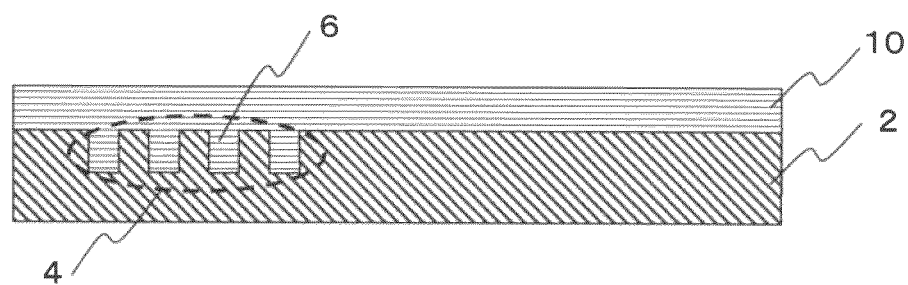

FIG. 3D is a view showing a halfway growth of the GaN layer 10. At the stage of the halfway growth, the GaN layer 10 is thinner than the depth of the carved concaves 6. Therefore, the GaN layer 5 reflects the convexoconcave of the alignment mark 4 to have an uneven surface above the alignment mark 4. As shown in FIG. 3E, when the GaN layer 10 is thicker than a certain thickness, the GaN layer 10 does not reflect the convexoconcave of the alignment mark 4 any more to have a flat surface.

When the growth is stopped at the stage of the halfway growth shown in FIG. 3D, a wide-gap semiconductor substrate is obtained, which has the GaN layer as a surface layer which has an uneven surface reflecting the carved concaves 6 above the alignment mark 4. Two cases are explained with reference to FIGS. 4A and 4B, where two wide-gap semiconductor substrates having uneven and flat surfaces of the GaN layers 10 are aligned, respectively.

Figure 4A:
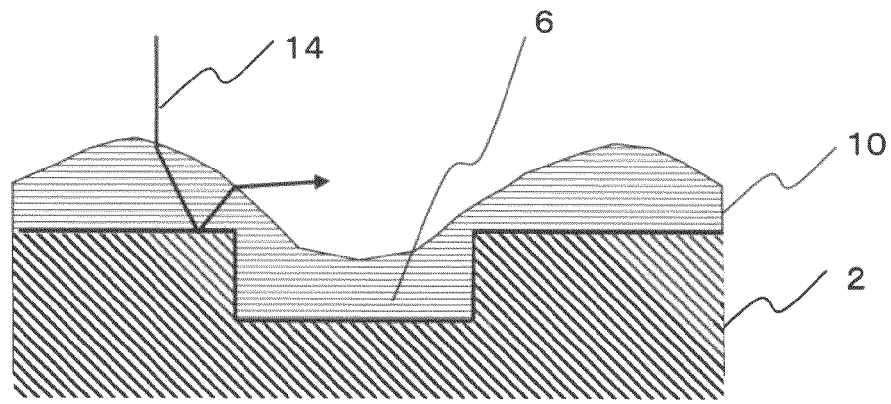
FIGS. 4A and 4B are views schematically showing cases where the GaN layer is thinner than d and the GaN layer is thicker than 2d, respectively, when "d" is a depth of carved concaves of the alignment mark.
Figure 4B:
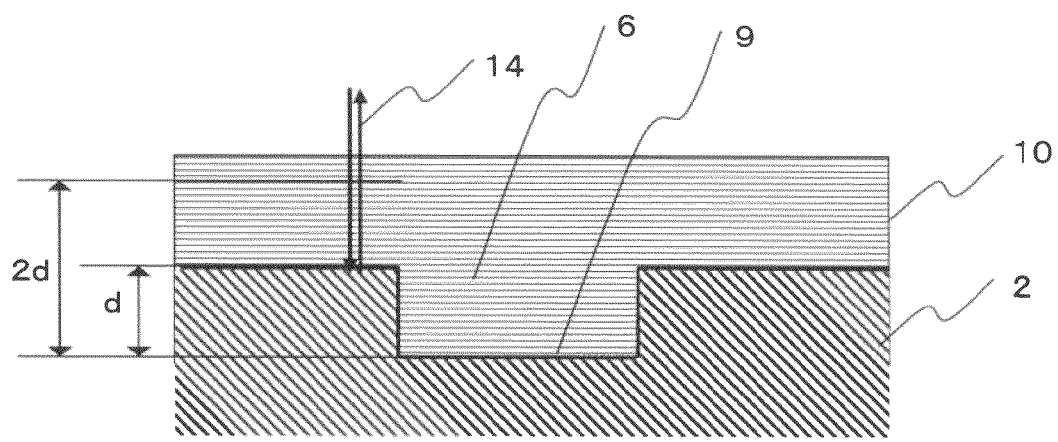

FIGS. 4A and 4B are views schematically showing cases where the GaN layer 10 is thinner than d and the GaN layer is thicker than 2d, respectively. Here, "d" represents the depth of the carved concave 6. FIGS. 4A and 4B correspond to FIGS. 3D and 3E, respectively. As shown in FIG. 4A, detecting light 14 is directed perpendicularly to the Si layer 2 to be first incident on the GaN layer 10 having the uneven surface and a high refractive index to visible light. The detecting light 14 inflects at the surface of the GaN layer 10 as a result of the unevenness and the high refractive index thereof. Therefore, the detecting light 14 is incident not perpendicularly onto the Si layer 2 to be refracted again at the surface of the GaN layer 10 when it comes out of the GaN layer 10. For this reason, the detecting light 14 reflected at the surfaces of the GaN layer and the Si layer 2 is scattered in random directions, thereby making it impossible to detect edges of the carved concave 6 formed on the Si layer 2 for the substrate alignment.

However, as shown in FIGS. 3D and 3E, the "swell-size" of the surface of the GaN layer 10 decreases with increasing the thickness thereof. Then, the surface of the GaN layer 10 eventually becomes flat also as shown in FIG. 4E. The reason is inferred as follows. In an initial growth of the GaN layer 10, GaN molecules having reached a substrate surface move thermally and actively on the substrate surface and aggregate to form islands thereon. In other words, the molecules form the islands so that the molecules make the surface area of the islands as small as possible. Under such a condition, the GaN layer 10 starts to grow more preferentially from bottom edges of the carved concaves 6 than from the convex portion of the alignment mark 4 of convexoconcave. That is, the GaN layer 10 can grow while controlling an increase in the surface area thereof in the carved concave 6.

As shown in FIG. 4A, when the GaN layer 10 is further grown to mostly fill the carved concave 6, a growth mode of the GaN layer 10 becomes two-dimensional. Thereby, the GaN layer 10 is grown as a continuous film. As further shown in FIG. 4B, the GaN layer 10 becomes thick so that the GaN layer 10 is thicker than the depth "d" of the carved concave 6 on the Si layer 2. Then, the surface of the GaN layer 10 is mostly flat even above the alignment mark 4.

Specifically, when the GaN layer 10 is formed to have a thickness of about 2d or more which is measured from the bottom 9 of the carved concave 6, the surface of the GaN layer 10 is mostly flat even above the alignment mark 4 as shown in FIG. 3E. The flat surface thereof allows it to carry out a highly accurate substrate alignment as shown in FIG. 4B. Here, "d" is defined as a distance between the main surface of the Si layer 2 and the bottom 9 of the carved concave 6, as shown in FIG. 4B. That is, the wide gap semiconductor substrate shown in FIG. 2 or FIG. 3E in accordance with this embodiment is a wide gap semiconductor substrate with an alignment mark buried preliminarily therein. For this reason, when a semiconductor device or a semiconductor module is fabricated on this wide gap semiconductor substrate using visible light, it is not necessary to newly fabricate an alignment mark on the GaN layer of the wide gap semiconductor substrate. If needed, the wide gap semiconductor substrate can undergo a wafer planarization processing such as CMP (Chemical Mechanical Polishing) to gain a flatter surface.

As mentioned above, according to the first embodiment, a wide-gap semiconductor substrate is provided, which has a large-area GaN layer epitaxially grown on a large-area Si layer and allows it to carry out a substrate alignment for the wide-gap semiconductor substrate with visible light.

Second Embodiment

Figure 5A:
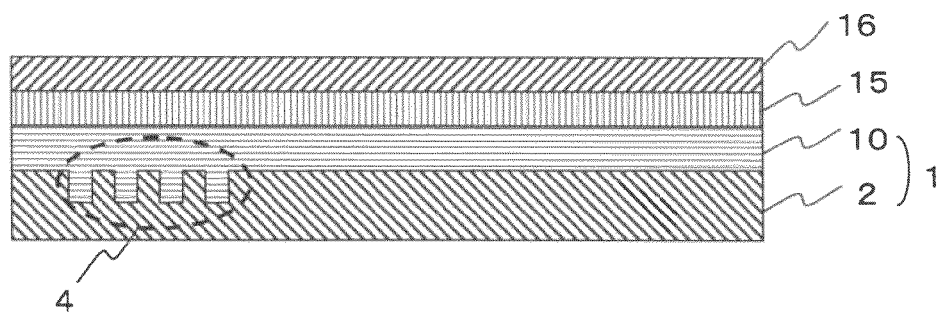
FIGS. 5A to 5C are views showing early steps of a method according to a second embodiment to fabricate a wide-gap semiconductor device on a GaN layer on the wide-gap semiconductor substrate with the alignment mark buried preliminarily therein according to the first embodiment.

A second embodiment will be explained with reference to FIGS. 5A to 5O. FIGS. 5A to 5O are views showing steps of a method to fabricate a wide-gap semiconductor device to be formed on the GaN layer 10, i.e., a main semiconductor layer of a wide-gap semiconductor substrate 1.

As shown in FIG. 5A, the wide-gap semiconductor substrate 1 is prepared, which has an undoped 1.5 μm-thick GaN layer 10 provided onto the Si layer 2. The wide-gap semiconductor substrate 1 is referred to as the "GaN substrate 1" below. The undoped GaN layer 10 serves as an electron transit layer in the GaN substrate 1. A Si-doped n-type AlGaN layer 15 is formed as an electron supplying layer on the GaN layer 10. Furthermore, a first insulating layer 16 is formed on the n-type AlGaN layer 15. The first insulating layer 16 includes silicon nitrides such as SiN, $Si_3N_4$, $SiN_x$(x: an arbitrary numerical value). More specifically, the first insulating layer 16 is formed using a plasma CVD (Chemical Vapor Deposition) method to preferably have a thickness of about 50 nm.

Figure 5B:
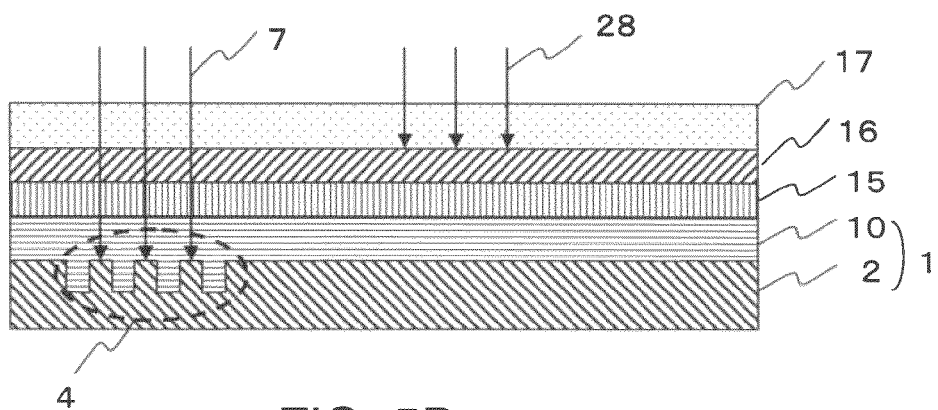
Figure 5C:
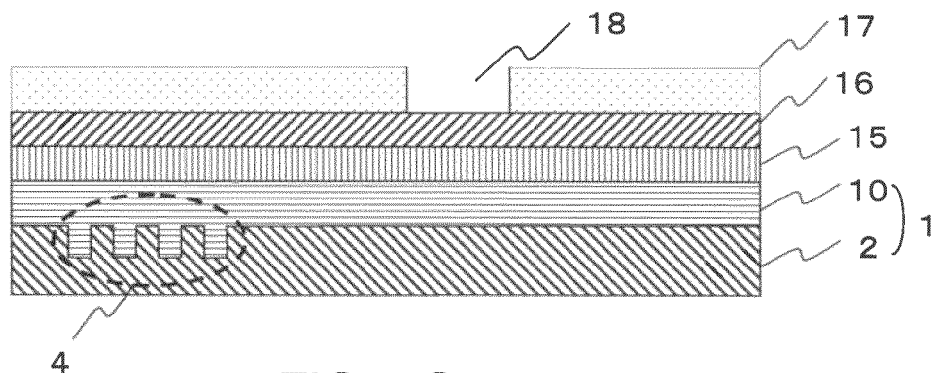
Figure 5D:
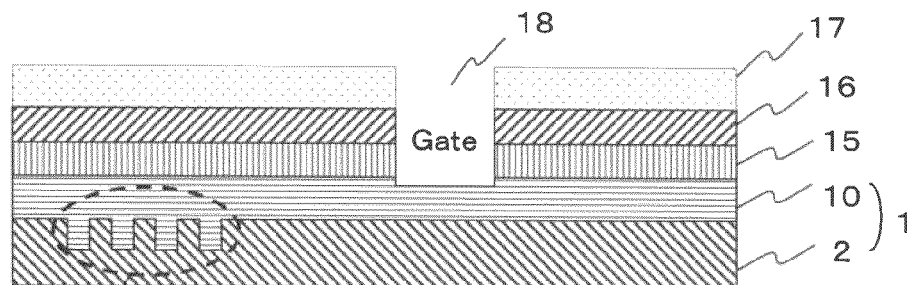
FIGS. 5D to 5F are views showing early steps of the method according to the second embodiment to form a gate of the wide-gap semiconductor device on the GaN layer on the wide-gap semiconductor substrate.

Next, as shown in FIG. 5B, resist is applied entirely to the GaN substrate 1 with a spin coater to provide a resist layer 17. A portion 18 for a gate to be formed is exposed to the light 28. The portion 18 for a gate to be formed is referred to as the "gate-forming area" 18 below. Just before the exposing of the gate-forming portion, a direct substrate alignment for the GaN substrate 1 is carried out while exposing the GaN substrate 1 to the detecting light 7 with a wavelength of 633 nm. This direct substrate alignment allows it to accurately align the gate-forming area 18 to form a gate in the device-forming area 3 shown in FIGS. 1A and 1B. Next, as shown in FIG. 5C, the resist on the gate-forming area 18 is removed with a developer. Furthermore, as shown in FIG. 5D, the gate-forming area 18 is etched until the etched portion reaches the AlGaN layer 15 or the GaN layer 10. FIG. 5D shows a case where the etched portion has reached the GaN layer 10. Further as shown in FIG. 5D, the resist layer 17 is removed by an organic solvent entirely from the GaN substrate 1 having the gate-forming area 18 etched.

Figure 5E:
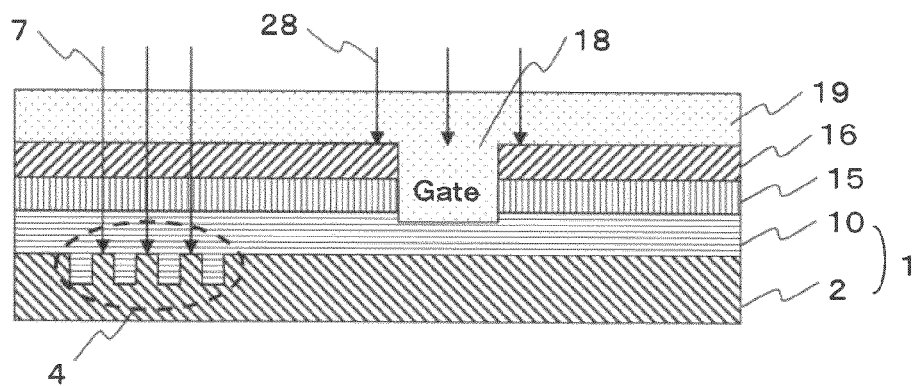
Figure 5F:
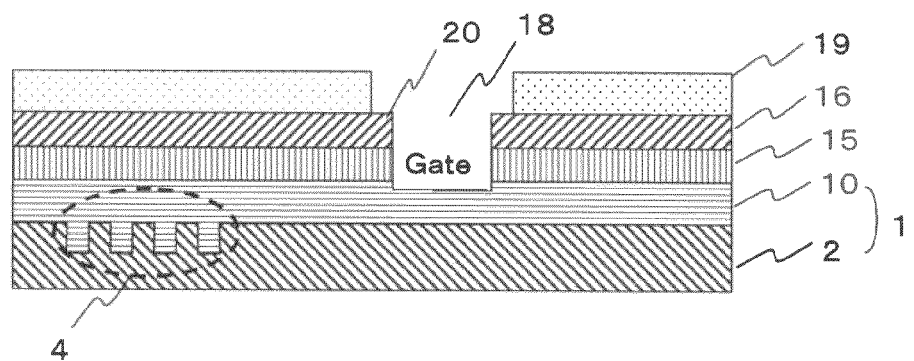
Figure 5G:
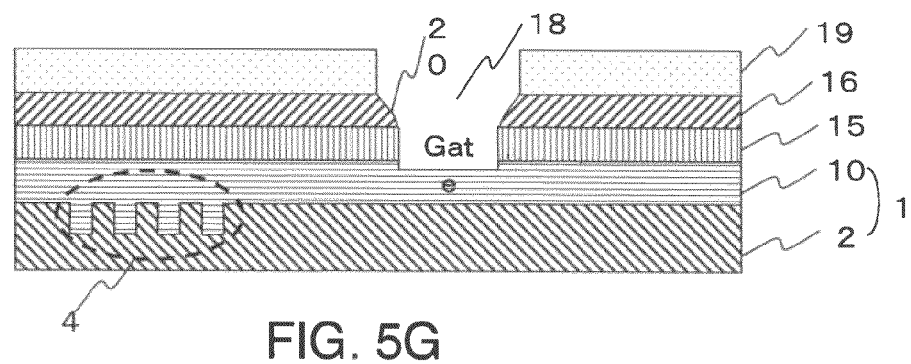
FIGS. 5G to 5I are views showing steps of the method according to the second embodiment to form a recess structure of the gate of the wide-gap semiconductor device on the GaN layer on the wide-gap semiconductor substrate.
Figure 5H:
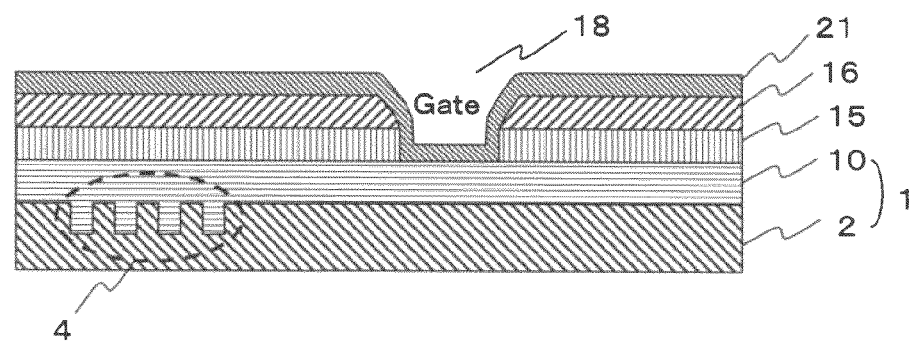

Subsequently, resist is again newly applied thereto to form the resist layer 19. Just before an area larger than the gate-forming area 18 is exposed to the light 28, the alignment mark 4 is irradiated with the detecting light 7 with a wavelength of 633 nm to directly align the GaN substrate 1 as shown in FIG. 5E so that an edge 20 of the first insulating layer 16 is exposed to the air as shown in FIG. 5F. Then, the resist layer 19 can be partially removed with high accuracy so that the partially removed area including the edge 20 thereof is exposed to the air to be larger than the gate-forming area 18. After the partially removing of the resist layer 19, the whole GaN substrate 1 is loaded into an ion-etching apparatus (not shown). The GaN substrate 1 is loaded thereinto so that ions are incident obliquely, i.e., not perpendicularly to the GaN substrate 1. Then, ion etching is carried out while rotating the GaN substrate 1. The oblique incidence of ions etches the edge 20 of the first insulating layer 16, thereby forming a recess structure in the gate-forming area 18 as shown in FIG. 5G. The removing of the resist layer 19 is followed by washing the GaN substrate 1 to be cleaned. Then, a second insulating layer 21 (a gate insulator film) is formed entirely on the GaN substrate 1 as shown in FIG. 5H.

Figure 5I:
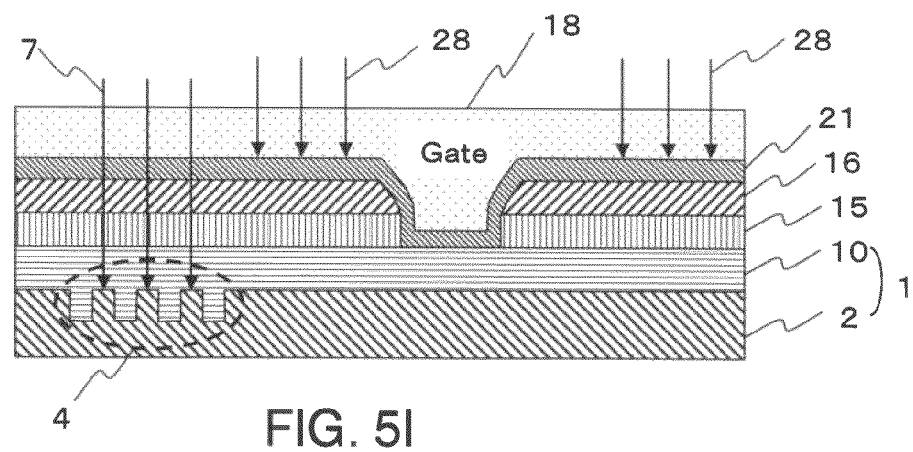

The second insulating layer 21 covers both the bottom and the sidewall of the gate-forming area 18 and the exposed surface of the first insulating layer 16, thereby serving as a gate insulator film and a protective film. The second insulating layer 21 includes a highly dielectric insulator, such as SiN, $SiO_2$, or $Al_2O_3$. The second insulating layer 21 is formed using a magnetron sputtering apparatus, and preferably has a thickness of 30 nm. Resist is applied again entirely to the GaN substrate 1 to form a resist layer 22. Areas for a source and a drain to be formed are exposed to the light 28 as shown in FIG. 5I. The areas for the source and the drain are referred to as the "source-forming area" and the "drain-forming area", respectively, below. Just before the exposing of the source- and drain-forming areas, a direct substrate alignment is carried out for the GaN substrate 1 using the detecting light 7 with a wavelength of 633 nm. This substrate alignment allows it to accurately determine the positions of the source- and drain-forming areas 23 and 24. Thereby, GaN power devices formed on the respective device-forming areas 3 shown in FIG. 1 have small variations in their source/drain distances, thereby allowing it to acquire GaN power devices having small variations in the properties such as an on-state resistance, etc. That is, it is possible to reduce the on-state resistances and their variations of GaN-series wide-gap semiconductor devices.

Figure 5J:
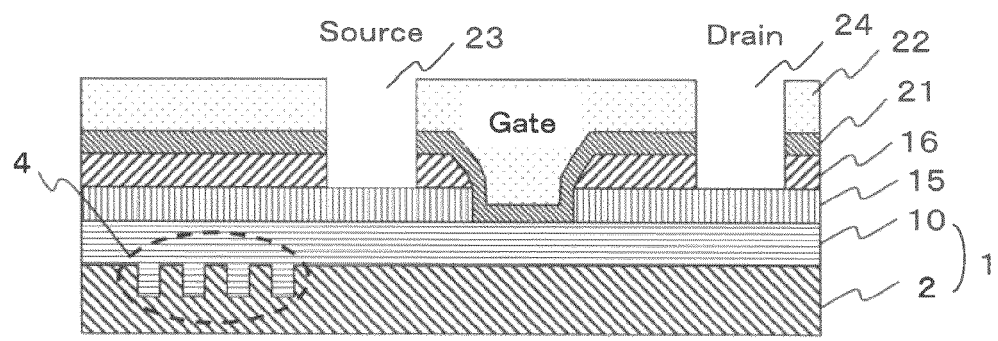
FIGS. 5J to 5L are views showing steps of the method according to the second embodiment to form a source and a drain of the wide-gap semiconductor device on the GaN layer on the wide-gap semiconductor substrate.
Figure 5K:
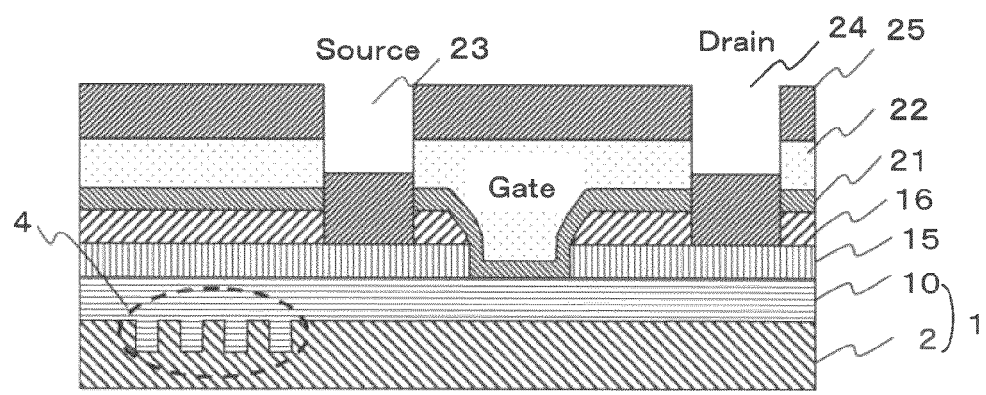
Figure 5L:
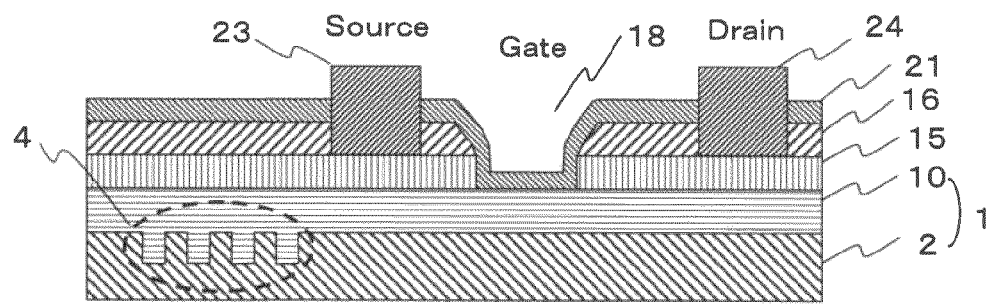

After the source- and drain-forming areas 23, 24 are exposed to the light 28 as shown in FIG. 5I, the resist layer 22 on the portions 23, 24 shown in FIG. 5J is locally removed. As shown in FIG. 5J, the first insulating layer 16 and the second insulating layer 21 are etched by dry-etching in the areas 23 and 24 so that the etched portions reach the n-type AlGaN layer 15. After the dry-etching of the source- and drain-forming areas 23 and 24, a laminated film of titanium/aluminum (Ti/Al) is formed entirely on the GaN substrate 1 to form a source electrode 23 and a drain electrode 24 as shown in FIG. 5K. The source electrode 23 and the drain electrode 24 including Al/Ti can be electrically connected to the n-type AlGaN layer 15 with an ohmic resistance. After forming the laminated film of titanium/aluminum (Ti/Al), the resist layer 22 is entirely removed with an organic solvent. A halfway device structure after the entirely removing of the resist layer 22 is shown in FIG. 5L. As a result, a recess structure is formed in the gate portion 18 and is covered with the gate insulator film 21.

Figure 5M:
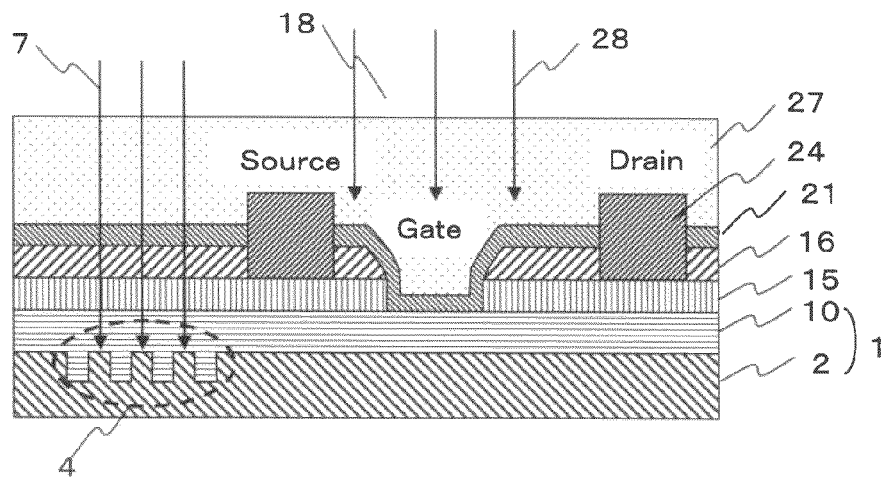
FIGS. 5M to 5O are views showing steps of the method according to the second embodiment to form a gate electrode after forming the source and the drain of the wide-gap semiconductor device on the GaN layer on the wide-gap semiconductor substrate, and a sectional view showing a field-effect transistor completed using the method to fabricate the wide-gap semiconductor substrate according to the second embodiment.
Figure 5N:
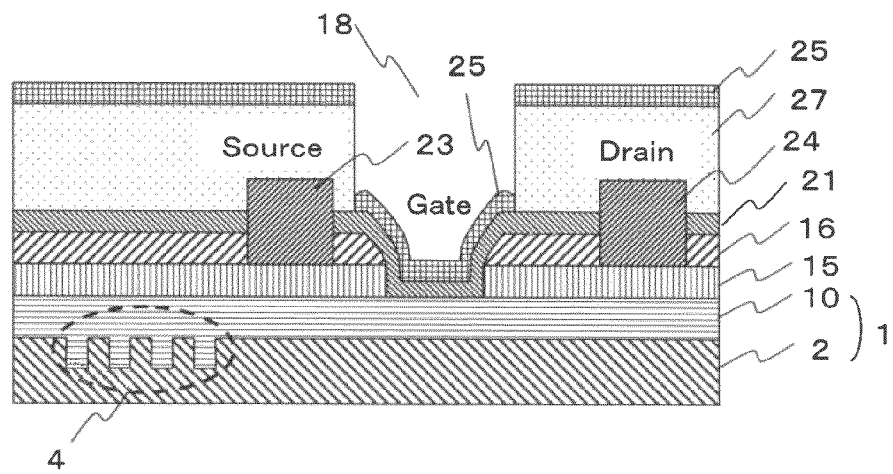
Figure 5O:
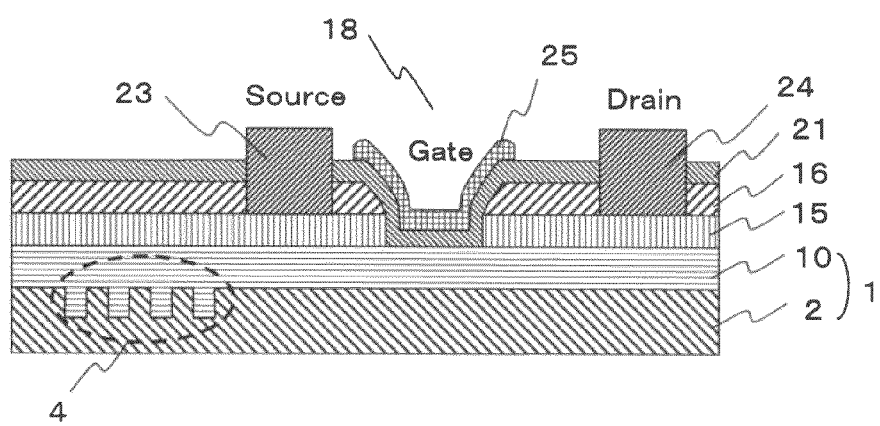
Figure 6A:
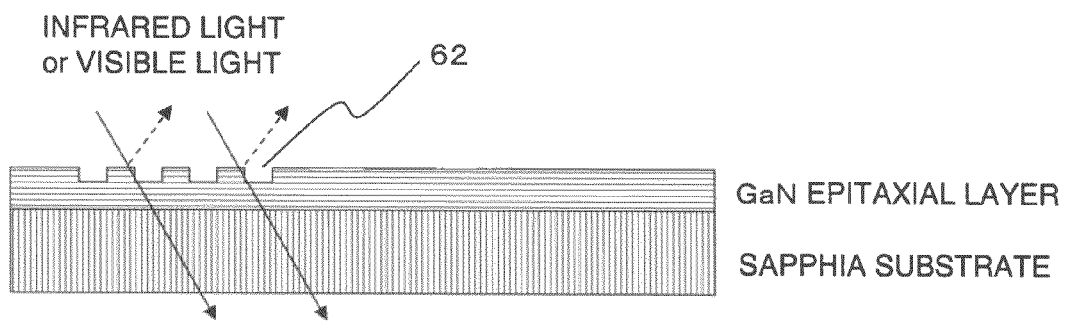
FIGS. 6A to 6C are views showing alignment marks formed in a wide gap semiconductor substrate according to a conventional technique.
Figure 6B:
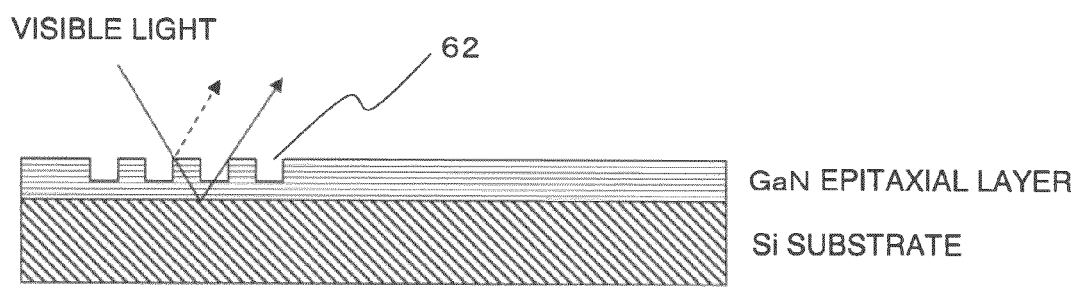
Figure 6C:
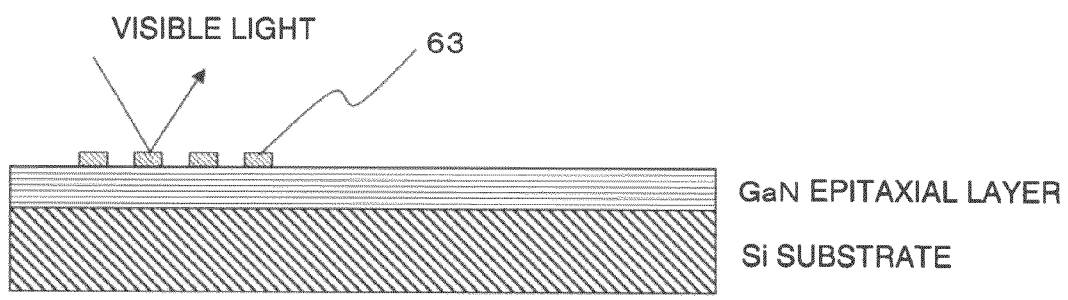

As shown in FIG. 5M, resist is applied entirely to the GaN substrate 1 using a spin coater to form a resist layer 27. Then, an area of the resist layer 27 including the recess structure is exposed to the light 28. Just before the exposure of the resist layer 27, the alignment mark 4 is irradiated with the detecting light 7 having a wavelength of 633 nm to carry out a direct substrate alignment for the GaN substrate 1. The direct substrate alignment allows it to accurately determine the position of a gate electrode. After the exposure of the resist layer 27, the resist layer 27 on the gate portion 18 is removed to expose the recess structure to the air. It should be noted that the recess structure can be accurately exposed to the air owing to the alignment mark 4. Subsequently, a Ni film is formed entirely on the GaN substrate 1 including the device forming areas 3 shown in FIG. 1.

Finally, the resist layer 27 is entirely removed from the whole GaN substrate 1 to complete a wide-gap GaN semiconductor device as shown in FIG. 5O.

As described above, according to the first embodiment, a wide-gap semiconductor substrate includes a narrow-gap semiconductor substrate, a wide-gap semiconductor layer and an alignment mark. The narrow-gap semiconductor substrate has a main surface. The wide-gap semiconductor layer is epitaxially grown on the narrow-gap semiconductor substrate. The alignment mark is preliminarily carved in a prescribed position on the main surface so that the alignment mark is preliminarily buried in the wide-gap semiconductor substrate. The wide-gap semiconductor substrate allows it to use visible light for detecting the alignment mark and a strong intensity of the visible light reflected from the alignment mark, thereby enabling it to accurately carry out a substrate alignment for the wide-gap semiconductor substrate.

According to the second embodiment, a method to fabricate a wide gap semiconductor device on a wide-gap semiconductor substrate with an alignment mark preliminarily buried therein according to the first embodiment includes a step of applying resist to the wide-gap semiconductor substrate and a step of irradiating the alignment mark with visible light and detecting light reflected therefrom to align the wide-gap semiconductor substrate.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A wide-gap semiconductor substrate comprising:
a narrow-gap semiconductor layer having a main surface;
a wide-gap semiconductor layer which is epitaxially grown on the narrow-gap semiconductor layer; and
an alignment mark which is preliminarily carved in a prescribed position on the main surface of the narrow-gap semiconductor layer so that the alignment mark is buried in the wide-gap semiconductor layer,
wherein the narrow-gap semiconductor layer is a Si layer and the wide-gap semiconductor layer includes a nitride semiconductor layer which is made of at least one of a GaN layer and an AlGaN layer,
the main surface of the narrow-gap semiconductor layer, which is not provided with the alignment mark, is flat, and
a first distance between the main surface of the narrow-gap semiconductor layer and a bottom of the alignment mark is d, a second distance between a main surface of the wide-gap semiconductor laver at a region provided with the alignment mark and the bottom of the alignment mark is 2d or more.

2. A wide-gap semiconductor substrate comprising:
a narrow-gap semiconductor layer having a main surface;
a wide-gap semiconductor layer which is epitaxially grown on the narrow-gap semiconductor layer; and
an alignment mark which is preliminarily carved in a prescribed position on the main surface of the narrow-gap semiconductor laver so that the alignment mark is buried in the wide-gap semiconductor substrate,
wherein the narrow-gap semiconductor layer is a Si layer and the wide-gap semiconductor layer includes a nitride semiconductor layer which is made of at least one of a GaN layer and an AlGaN layer,
the main surface of the narrow-gap semiconductor layer, which is not provided with the alignment mark, is flat, and
a first distance between the main surface of the narrow-gap semiconductor laver and a bottom of the alignment mark is d, a second distance between a main surface of the wide-gap semiconductor layer at a region provided with the alignment mark and the bottom of the alignment mark is 2d or more.

3. A method to fabricate a wide gap semiconductor device on a wide-gap semiconductor substrate, comprising:
applying resist to the wide-gap semiconductor substrate, the wide-gap semiconductor substrate including:
a narrow-gap semiconductor layer having a main surface;
a wide-gap semiconductor layer which is epitaxially grown on the narrow-gap semiconductor layer; and
an alignment mark which is preliminarily carved in a prescribed position on the main surface of the narrow-gap semiconductor layer so that the alignment mark is buried in the wide-gap semiconductor substrate,
wherein the main surface of the narrow-gap semiconductor laver, which is not provided with the alignment mark, is fiat, and
a first distance between the main surface of the narrow-gap semiconductor layer and a bottom of the alignment mark is d, a second distance between a main surface of the wide-gap semiconductor laver at a region provided with the alignment mark and the bottom of the alignment mark is 2d or more, and
irradiating the alignment mark with visible light and detecting light reflected from the alignment mark to align the wide-gap semiconductor substrate; and
detecting a position of the wide-gap semiconductor device using the alignment mark and forming an electrode on the wide-gap semiconductor layer,
wherein the narrow-gap semiconductor layer is a Si layer and the wide-gap semiconductor layer is made of at least one of a GaN layer and an AlGaN layer.

4. The method according to claim 3, wherein
the wide-gap semiconductor device includes a field-effect transistor; and
the alignment mark is irradiated with visible light and light reflected therefrom is detected to determine positions of a drain, a source and a gate of the field-effect transistor.

* * * * *